US012362494B2

(12) United States Patent
Tankielun et al.

(10) Patent No.: US 12,362,494 B2
(45) Date of Patent: Jul. 15, 2025

(54) METALLIC WAVEGUIDE ANTENNA

(71) Applicant: Rohde & Schwarz GmbH & Co. KG, Munich (DE)

(72) Inventors: Adam Tankielun, Ottobrunn (DE); Shreyas Bharadwaj, Ilmenau (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 191 days.

(21) Appl. No.: 18/337,518

(22) Filed: Jun. 20, 2023

(65) Prior Publication Data
US 2024/0429615 A1    Dec. 26, 2024

(51) Int. Cl.
*H01Q 13/06*    (2006.01)
*G01R 29/08*    (2006.01)

(52) U.S. Cl.
CPC ......... *H01Q 13/06* (2013.01); *G01R 29/0821* (2013.01)

(58) Field of Classification Search
CPC .... G01R 29/08; G01R 29/0821; G01R 29/10; G01R 29/105; H01Q 13/06; H01Q 13/065; H01Q 19/08; H01Q 19/13; H01Q 19/132
See application file for complete search history.

(56) References Cited

U.S. PATENT DOCUMENTS

| | | | |
|---|---|---|---|
| 4,090,203 A * | 5/1978 | Duncan | H01Q 21/22 343/753 |
| 4,673,947 A | 6/1987 | Newham | |
| 5,248,987 A | 9/1993 | Lee | |
| 5,818,395 A * | 10/1998 | Wolcott | H01Q 1/288 343/915 |
| 5,952,984 A | 9/1999 | Kuramoto et al. | |
| 6,476,761 B2 * | 11/2002 | Martin | H01Q 25/008 343/753 |
| 6,549,173 B1 * | 4/2003 | King | H01Q 13/065 343/786 |
| 7,786,946 B2 | 8/2010 | Diaz et al. | |
| 10,224,638 B2 * | 3/2019 | Artemenko | H01Q 15/08 |
| 2002/0057220 A1 | 5/2002 | Sabet et al. | |
| 2015/0116154 A1 | 4/2015 | Artemenko et al. | |
| 2020/0112104 A1 | 4/2020 | Bieti | |
| 2020/0212588 A1 | 7/2020 | Rofougaran et al. | |

(Continued)

FOREIGN PATENT DOCUMENTS

EP    3719929 B1    10/2022
JP    2022045682 A    3/2022

OTHER PUBLICATIONS

Poyanco, J. et al., "Cost-effective wideband dielectric planar lens antenna for millimeter wave applications," scientific reports, https://doi.org/10.1038/s41598-022-07911-z, dated 2022, 10 pages.

(Continued)

*Primary Examiner* — Tho G Phan
(74) *Attorney, Agent, or Firm* — Westman, Champlin & Koehler, P.A.

(57) ABSTRACT

A metallic waveguide antenna comprising a waveguide having a waveguide through hole adapted to guide electromagnetic waves; and a dielectric fixture made of a material with a low electrical permittivity attached to a front portion of said waveguide and having a fixture through hole aligned with the waveguide through hole of the attached waveguide.

18 Claims, 2 Drawing Sheets

(56) References Cited

U.S. PATENT DOCUMENTS

Figure 1:
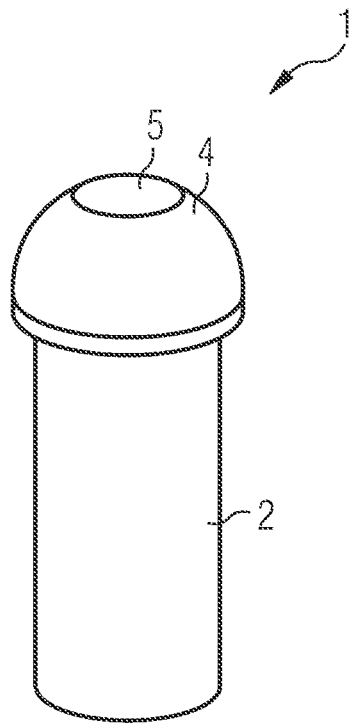

2021/0159597 A1   5/2021  Biswas et al.
2022/0239007 A1   7/2022  Biswas
2023/0011824 A1   1/2023  Chisum et al.

OTHER PUBLICATIONS

European Search Report for European Patent Application No. EP 24 17 3041, dated Sep. 27, 2024.

* cited by examiner

METALLIC WAVEGUIDE ANTENNA

FIELD OF THE INVENTION

The invention relates to a metallic waveguide antenna and to a compact antenna test range (CATR) system including at least one metallic waveguide antenna.

TECHNICAL BACKGROUND

A compact antenna test range (CATR) system typically comprises a feed antenna and a reflector assigned to the feed antenna. Feed antennas can be formed by axial choke horn antennas with a waveguide feed which is band—limited due to underlying waveguide physics. There is a cut-off frequency at the low frequency and higher—order modes at the high frequency. Thus, existing feed antennas as well as conventional CATR systems having these feed antennas are limited to signals with frequencies beneath around 50 GHz. However, for modern communication standards such as new radio or rather 5G, it is necessary to process signals that have frequencies up to around 90 GHz.

Conventional feed antennas radiating waves in a wide frequency band within the GHz spectrum comprise a significant unwanted variation of their radiation pattern over the frequency band. To overcome this variation automatic feed switcher with mechanical movements of a set of feed antennas are used to place them in the focal point of the reflector of the CATR system. As a consequence, RF-switching of multiple feed coaxial cables to broad band RF frontend is required.

SUMMARY OF THE INVENTION

Accordingly, there is a need to provide a waveguide antenna with a reduced variation of radiation pattern over a wide frequency range, and in a particular to provide a waveguide antenna with a reduced variation of radiation pattern which can be used as a feed antenna in a CATR system.

The present invention provides a metallic waveguide antenna and a compact antenna test range (CATR) system having the features of the independent claims.

Accordingly, the present disclosure provides according to a first aspect a metallic waveguide antenna comprising a waveguide having a waveguide through hole adapted to guide electromagnetic waves and comprising a dielectric fixture made of a material with a low electrical permittivity attached to a front portion of said waveguide and having a fixture through hole aligned with the waveguide through hole of the attached waveguide.

Using such metallic waveguide antennas as feed antennas allows employing a lower number of feed antennas in a CATR system. Further, there is a reduced need for mechanical movements of feeds. There is also a reduced need for RF switch modules to connect multiple feed cables to a broadband frontend of RF equipment.

In a possible embodiment of the metallic waveguide antenna the antenna is a broadband metallic waveguide antenna comprising a wide frequency range of extremely high frequencies having a frequency of at least 10 Giga Hz.

In a possible embodiment of the metallic waveguide antenna the wide frequency range of said broadband metallic waveguide antenna is located in a frequency spectrum spanning from 50 Giga Hz and 90 Giga Hz.

In a possible embodiment of the metallic waveguide antenna a size of the fixture through hole is at least one half of the wavelength at the highest frequency of the wide frequency range of said broadband metallic waveguide antenna.

In a possible embodiment of the metallic waveguide antenna, a size of the fixture through hole corresponds to the aperture size of said metallic waveguide antenna.

In a possible embodiment of the metallic waveguide antenna, the dielectric fixture comprises an inner surface formed by the fixture through hole of the dielectric fixture and comprises an outer boundary surface shaped around an antenna phase center of said metallic waveguide antenna.

In a possible embodiment of the metallic waveguide antenna, the outer boundary surface shaped around an antenna phase center of said metallic waveguide antenna comprises a spherical shape.

In a possible embodiment of the metallic waveguide antenna, the inner surface of the dielectric fixture formed by the fixture through hole is conical having a small flare angle with respect to an axial direction of the fixture through hole.

In a possible embodiment of the metallic waveguide antenna, the flare angle is less than 30 degrees, in particular less than 2 degrees.

In a possible embodiment of the metallic waveguide antenna, the conical fixture through hole comprises at a first end facing the waveguide through hole with a first diameter and comprises at a second opposite end with a second diameter being wider than the first diameter.

In a possible embodiment of the metallic waveguide antenna, a height of the dielectric fixture is between at least one wavelength and five wavelengths at the highest frequency of the wide frequency range of said broadband metallic waveguide antenna.

In a possible embodiment of the metallic waveguide antenna, the dielectric fixture is made of a material with a low relative electrical permittivity of less than 1.5.

In a possible embodiment of the metallic waveguide antenna, the dielectric fixture is made of a foamy material.

In a possible embodiment of the metallic waveguide antenna, the fixture through hole is filled with a filling material with a low relative electrical permittivity between 1.0 and 1.5 or is plugged by a filling plug made of a material with a low relative electrical permittivity between 1.0 and 1.5.

In a possible embodiment of the metallic waveguide antenna, the filling plug is glued into the fixture through hole or is inserted into the fixture through hole in a removable or replaceable manner.

In a possible embodiment of the metallic waveguide antenna, the front portion of said waveguide is provided with threads used for attachment of the dielectric fixture to said waveguide.

In a possible embodiment of the metallic waveguide antenna, the metallic waveguide antenna comprises a wideband feed antenna of a CATR system.

The invention provides according to a further aspect a compact antenna test range (CATR) system including at least one metallic waveguide feed antenna comprising a waveguide having a waveguide through hole adapted to guide electromagnetic waves and comprising a dielectric fixture made of a material with a low electrical permittivity attached to a front portion of said waveguide and having a fixture through hole aligned with the waveguide through hole of the attached waveguide.

In a possible embodiment, the CATR system further comprises a parabolic reflector which is adapted to collimate the received spherical wave into a planar wave used to illuminate a device under test (DUT) provided in a measurement zone, wherein the metallic waveguide feed antenna is adapted to radiate a spherical wave towards the parabolic reflector.

In a possible embodiment, the CATR system further comprises a shielded anechoic chamber, wherein the measurement zone is provided in the shielded anechoic chamber.

Where appropriate, the above-mentioned configurations and developments can be combined implementations can be combined with each other as desired, as far as this is reasonable.

Further possible configurations, developments and implementations of the invention also include combinations, which are not explicitly mentioned, of features of the invention which have been described previously or are described in the following with reference to the embodiments. In particular, in this case, a person skilled in the art will also add individual aspects as improvements or supplements to the basic form of the present invention.

CONTENT OF THE DRAWINGS

Figure 2:
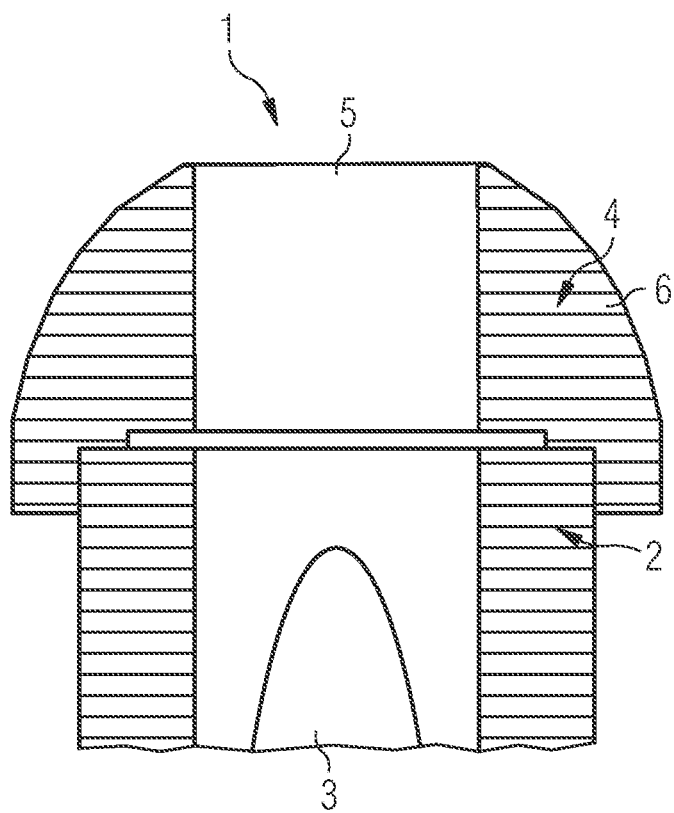
Figure 3:
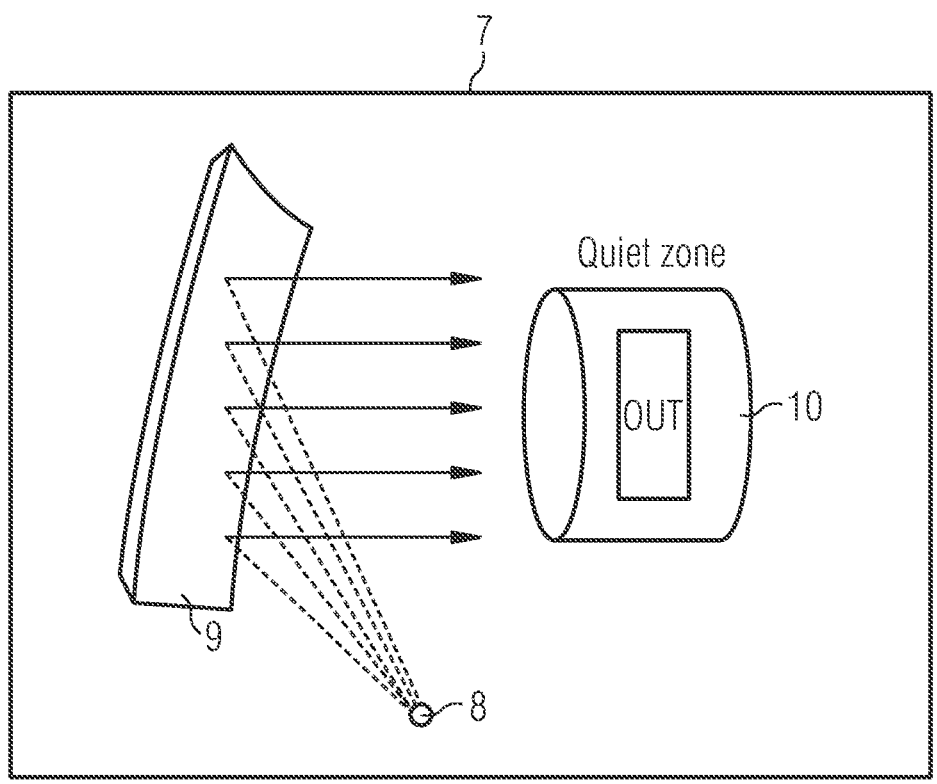

The present invention is described in greater detail in the following on the basis of the embodiments shown in the schematic figures of the drawings, in which:

FIG. 1 illustrates a view on an exemplary embodiment of a metallic waveguide antenna according to the present disclosure;

FIG. 2 schematically shows a cross-sectional view of a metallic waveguide antenna according to the present disclosure;

FIG. 3 illustrates a view on an exemplary embodiment of a compact antenna test range (CATR) system including at least one metallic waveguide feed antenna.

The appended drawings are intended to provide further understanding of the embodiments of the invention. They illustrate embodiments and, in conjunction with the description, help to explain principles and concepts of the invention.

Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated otherwise.

DESCRIPTION OF EMBODIMENTS

In FIG. 1, a view on an exemplary embodiment of a metallic waveguide antenna according to the present disclosure is illustrated.

In FIG. 1, the metallic waveguide antenna is denoted by reference numeral 1. The metallic waveguide antenna 1 comprises a waveguide 2 having a waveguide through hole 3 adapted to guide electromagnetic waves. The metallic waveguide antenna 1 further comprises a dielectric fixture 4 made of a material with a low electrical permittivity. The dielectric fixture 4 is attached to a front portion of the waveguide 2 and has a fixture through hole 5 aligned with the waveguide through hole 3 of the attached waveguide 2 as can also be seen in the cross section view of FIG. 2.

Making use of such metallic waveguide antennas 1 as feed antennas allows employing a lower number of feed antennas in a compact antenna test range (CATR) system 7 as also illustrated in FIG. 3. The metallic waveguide antenna 1 is applicable for single and dual-polarized feeds independent from the applied ortho-mode transducer solution.

In the embodiment illustrated in FIG. 1, 2 the shape of the waveguide through hole 2 is cylindrical, i.e. the through hole 2 has a circular cross section. Other shapes of the waveguide through hole 2 are possible, in particular a rectangular or conical shape.

The dielectric fixture 4 made of material with a low electrical materials and its specific shape as illustrated in FIGS. 1 and 2 is adapted to reduce a variation of the radiation pattern of the metallic waveguide antenna 1 over the wide frequency range of the electromagnetic wave radiated during testing of a device under test DUT. The radiation pattern of an antenna refers to the directional (angular) dependence of the strength of the radio waves radiated from the antenna. The radiation pattern of a transmitting antenna describes the magnitude and polarization of the field radiated by the antenna as a function of angle relative to the antenna. Directional antennas mostly do not comprise a symmetry in the radiation pattern. Directional antennas typically have a single peak direction in the radiation pattern. The peak direction is the direction where the bulk of the radiated power travels. Broadband antennas, often interchangeable referred to as wideband or wide-band antennas, are antennas that provide a solid antenna performance over a large range of frequencies.

In a possible embodiment of the metallic waveguide antenna 1, the antenna is a broadband metallic waveguide antenna comprising a wide frequency range of extremely high frequencies having a frequency of at least 10 Giga Hz. The size of the fixture through hole 5 is in a preferred embodiment at least one half of the wavelength at the highest frequency of the wide frequency range of the broadband metallic waveguide antenna 1.

In a possible embodiment of the metallic waveguide antenna 1, the size of the fixture through hole 5 corresponds to the aperture size of said metallic waveguide antenna 1.

In a possible embodiment of the metallic waveguide antenna 1, the dielectric fixture 4 comprises an inner boundary surface formed by the fixture through hole 5 of the dielectric fixture 4 and comprises an outer boundary surface 6 shaped around an antenna phase center APC of the metallic waveguide antenna 1. The antenna phase center APC is the point from which the electromagnetic radiation spreads spherically outward, with the phase of the signal being equal at any point on the sphere. Apparent phase center is used to describe the phase center in a limited section of the radiation pattern. The outer boundary surface 6 shaped around an antenna phase center APC of said metallic waveguide antenna 1 comprises in the embodiment illustrated in FIGS. 1 and 2 a spherical shape.

Other shapes which are close to the specified shape can be used in other embodiment (e.g. a cylindrical boundary). In a possible embodiment of the metallic waveguide antenna 1 the inner surface of the dielectric fixture 4 formed by the fixture through hole 5 is conical having a small flare angle with respect to an axial direction of the fixture through hole 5. The flare angle is less than 30 degrees, in particular less than 2 degrees. The inner boundary shape of the waveguide has a similar diameter as the antenna aperture.

In a possible embodiment of the metallic waveguide antenna 1 the conical fixture through hole 5 comprises at a first end facing the waveguide through hole 3 with a first diameter and comprises at a second opposite end with a second diameter being wider than the first diameter. The height of the dielectric fixture 4 is in a preferred embodiment between at least one wavelength and five wavelengths at the highest frequency of the wide frequency range of said broadband metallic waveguide antenna 1.

In a possible embodiment of the metallic waveguide antenna 1 the dielectric fixture 4 is made of a material with a low relative electrical permittivity of less than 1.5. The dielectric fixture 4 is made in preferred implementation of a foamy material. The foam material ensures that the fixture body of the dielectric fixture 4 is light and robust, as the fixture body can be compressed if necessary. The fixture body made of foam ensures that the metallic waveguide antenna 1 is at least partially protected by the fixture body.

In a possible embodiment of the metallic waveguide antenna 1 the fixture through hole 5 is filled with a filling material with a low relative electrical permittivity between 1.0 and 1.5. In an alternative embodiment the fixture through hole 5 is plugged by a plug made of a material with a low relative electrical permittivity between 1.0 and 1.5. In a further possible embodiment of the metallic waveguide antenna 1 the filling plug is glued into the fixture through hole 5 or is inserted or pressed into the fixture through hole 5 in a removable or replaceable way.

The inner part of the dielectric waveguide fixture 4 is made of a material having a lower permittivity than the material of the outer part of the dielectric waveguide fixture 4. In a possible embodiment the inner part is formed by the fixture through hole 5 wherein the filling material is formed by air having a low relative permittivity very close to one.

The outer part can be made of a foamy material with a low relative permittivity of less than 1.5.

The electrical permittivity of free space, co, represents the smallest possible value of permittivity. The relative permittivity of all other substances or materials is greater than 1. These substances are called dielectric materials or simply dielectrics. A dielectric is a material that has low conductivity but a dielectric constant greater than 1.

Other embodiments are possible, too. In a possible other embodiment, the dielectric waveguide fixture 4 is made of a single part with a gradually changing relative permittivity having the lowest permittivity at its center, i.e. along the directional axis of the metallic waveguide antenna 1.

In a further possible embodiment of the metallic waveguide antenna 1 the front portion of the waveguide 2 is provided with threads used for attachment of the dielectric fixture 4 to the waveguide 2. In this embodiment, the waveguide 2 is detachable by means of the threaded interface. This allows replacing the dielectric fixture 4 for different test setups, in particular for different reflectors or devices under test DUT and/or for different test frequency bands.

In a possible embodiment of the metallic waveguide antenna 1, the wide frequency range of said broadband metallic waveguide antenna is located in a frequency spectrum spanning from 50 Giga Hz and 90 Giga Hz.

In a possible embodiment of the metallic waveguide antenna 1, the metallic waveguide antenna forms a wideband feed antenna 8 of a compact antenna test range (CATR) system 7 as Illustrated in FIG. 3. Using such metallic waveguide antennas 1 as wideband feed antennas allows to employ a lower number of feed antennas in a CATR system 7 (e.g. one feed antenna instead of three feed antennas).

A CATR system 7, e.g. such as shown schematically in FIG. 3, allows electrically large antennas to be measured at a significantly shorter distance than would be necessary in a traditional far-field test range. Compact ranges use a source antenna, i.e. the feed antenna 8 to radiate a spherical wave in the direction of a parabolic reflector 9, collimating it into a planar wave for aperture illumination of a device under test (DUT).

The lowest operational frequency of the CATR system 7 is determined by the size of the reflector 9, its edge treatment and the absorbers. The two edge treatments available are serrated edge for general purpose applications, and rolled edge to achieve higher accuracy for special applications. Multiple-feed systems may be used to improve the far-field characteristics. The compact range test system 7 also allows system level testing of a complete device architecture. The compact range system or compact antenna test range (CATR) system 7 can perform direct far-field measurements of electrically large antennas in a shielded anechoic chamber. It can use a large parabolic reflector 9 to project a small radiating source (feed) into the far field. The reflector 9 is used to transform a spherical wave into a plane wave with far-field characteristics.

The compact antenna test range (CATR) system 7 shown in FIG. 3 includes at least one metallic waveguide feed antenna 8 implemented by a metallic waveguide antenna 1 as shown in FIGS. 1, 2. The metallic waveguide feed antenna 8 of the CATR system 7 implemented by a metallic waveguide antenna 1 comprises a waveguide 2 having a waveguide through hole 3 adapted to guide electromagnetic waves and comprises a dielectric fixture 4 made of a material with a low electrical permittivity attached to a front portion of said waveguide 2 and having a fixture through hole 5 aligned with the waveguide through hole 3 of the attached waveguide 2 as shown in the cross section view of FIG. 2.

The metallic waveguide feed antenna 1 of the CATR system 7 is adapted to radiate a spherical wave towards a parabolic reflector 9 of said CATR system 7. The parabolic reflector 9 is adapted to collimate the received spherical wave into a planar wave used to illuminate a device under test DUT provided in a measurement zone 10 of the CATR system 7. The measurement zone 10 is provided in a preferred embodiment in a shielded anechoic chamber of said CATR system 7. The CATR system 7 used for radiation pattern measurement can comprise a positioning and control unit. The device under test DUT can be installed on a positioner and can be tested in a receiving mode. The device under test DUT can be rotated under control of the control unit and a pattern measurement is captured. A receiver can be used for capturing the signal for different axis of measurement. A signal source is used to generate a high frequency wave signal supplied to the feed antenna 8.

The CATR system 7 can for example be used for conducting radiation measurements on 5G millimetre wave devices in the range from 20 GHz to 90 GHz. The test system 7 provides a measurement zone 10—also referred to as the quiet zone—of e.g. up to 20 cm/7.8" in diameter within a benchtop footprint of less than 0.8 m2/8.6 ft2, with the capability of automatically rotating the device under test (DUT) during the measurement. A gold-coated reflector 9 and an ultra-wideband metallic waveguide feed antenna 8 can retain an excellent quiet zone uniformity with respect to both amplitude and phase, allowing engineers to conduct measurements all the way from 20 GHz to 90 GHz. The dual-polarized feed antenna 8 can be adapted to measure horizontal and vertical polarization in one go, cutting test times in half. Together with a high-precision, full 360 degree 2D positioner, any radiated performance measurement can be recorded at a high spatial resolution of better than 0.1 degrees, ensuring excellent accuracy and repeatability of test results.

An advantage of the CATR system 7 is that testing can be done in an indoor anechoic chamber. This avoids any weather and security related concerns while testing. One can avoid interference generated by other sources with the use of a shielding chamber. Moreover the test setup of a CATR system 7 is convenient for engineers due to its compact size.

The metallic waveguide antenna 1 can be used for a wide range of applications, in particular for testing communication systems, devices under test DUTs such as mobile phones or antennas under test AUTs.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive.

It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

What we claim is:

1. A compact antenna test range (CATR) system, the CATR system including:
   at least one metallic waveguide feed antenna comprising a waveguide having a waveguide through hole adapted to guide electromagnetic waves and comprising a dielectric fixture made of a material with a low electrical permittivity attached to a front portion of said waveguide and having a fixture through hole aligned with the waveguide through hole of the attached waveguide, wherein the
   CATR system further comprises a parabolic reflector which is adapted to collimate the received spherical wave into a planar wave used to illuminate a device under test (DUT) provided in a measurement zone, wherein the metallic waveguide feed antenna is adapted to radiate a spherical wave towards the parabolic reflector.

2. The CATR system of claim 1, further comprising a shielded anechoic chamber and wherein the measurement zone is provided in the shielded anechoic chamber.

3. The CATR system of claim 1,
   wherein the antenna is a broadband metallic waveguide antenna comprising a wide frequency range of extremely high frequencies having a frequency of at least 10 Giga Hz.

4. The CATR system of claim 3,
   wherein the wide frequency range of said broadband metallic waveguide antenna is located in a frequency spectrum spanning from 50 Giga Hz and 90 Giga Hz.

5. The CATR system of claim 3,
   wherein a size of the fixture through hole is at least one half of the wavelength at the highest frequency of the wide frequency range of said broadband metallic waveguide antenna.

6. The CATR system of claim 1,
   wherein a size of the fixture through hole corresponds to an aperture size of said metallic waveguide antenna.

7. The CATR system of claim 1,
   wherein the dielectric fixture comprises an inner surface formed by the fixture through hole of the dielectric fixture and comprises an outer boundary surface shaped around an antenna phase center said metallic waveguide antenna.

8. The CATR system of claim 7,
   wherein the outer boundary surface shaped around an antenna phase center of said metallic waveguide antenna comprises a spherical shape.

9. The CATR system of claim 7,
   wherein the inner surface of the dielectric fixture formed by the fixture through hole is conical having a small flare angle with respect to an axial direction of the fixture through hole.

10. The CATR system of claim 9,
    wherein the flare angle is less than 30 degrees, in particular less than 2 degrees.

11. The CATR system of claim 9,
    wherein the conical fixture through hole comprises at a first end facing the waveguide through hole with a first diameter and comprises at a second opposite end with a second diameter being wider than the first diameter.

12. The CATR system of claim 1,
    wherein a height of the dielectric fixture is between at least one wavelength and five wavelengths at the highest frequency of the wide frequency range of said broadband metallic waveguide antenna.

13. The CATR system of claim 1,
    wherein the dielectric fixture is made of a material with a low relative electrical permittivity of less than 1.5.

14. The CATR system of claim 13,
    wherein the dielectric fixture is made of a foamy material.

15. The CATR system of claim 1,
    wherein the fixture through hole is filled with a filling material with a low relative electrical permittivity between 1.0 and 1.5 or is plugged by a filling plug made of a material with a low relative electrical permittivity between 1.0 and 1.5.

16. The CATR system of claim 15,
    wherein the filling plug is glued into the fixture through hole or is inserted into the fixture through hole in a removable manner.

17. The CATR system of claim 1, wherein the front portion of said waveguide is provided with threads used for attachment of the dielectric fixture to said waveguide.

18. The CATR system of claim 1,
    wherein the metallic waveguide antenna comprises a wideband feed antenna of a compact antenna test range (CATR) system.

* * * * *